(12) United States Patent
Lin et al.

(10) Patent No.: US 10,381,303 B2
(45) Date of Patent: Aug. 13, 2019

(54) SEMICONDUCTOR DEVICE STRUCTURES

(71) Applicant: VANGUARD INTERNATIONAL SEMICONDUCTOR CORPORATION, Hsinchu (TW)

(72) Inventors: Ting-You Lin, Hsinchu (TW); Chi-Li Tu, Cyonglin Township, Hsinchu County (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 112 days.

(21) Appl. No.: 15/200,698

(22) Filed: Jul. 1, 2016

(65) Prior Publication Data
US 2018/0005942 A1 Jan. 4, 2018

(51) Int. Cl.
*H01L 23/522* (2006.01)
*H01L 23/31* (2006.01)

(52) U.S. Cl.
CPC ...... *H01L 23/5228* (2013.01); *H01L 23/3171* (2013.01)

(58) Field of Classification Search
CPC .............. H01L 23/5226; H01L 23/528; H01L 23/5283; H01L 23/315; H01L 23/3171; H01L 23/562; H01L 23/585; H01L 23/5228
See application file for complete search history.

(56) References Cited

U.S. PATENT DOCUMENTS

| | | | |
|---|---|---|---|
| 2012/0049323 A1* | 3/2012 | Ng | H01L 21/76834 257/537 |
| 2012/0241917 A1* | 9/2012 | Ide | H01L 23/481 257/622 |
| 2013/0241064 A1 | 9/2013 | Lin et al. | |
| 2016/0013125 A1* | 1/2016 | Kim | H01L 21/4846 174/251 |

(Continued)

FOREIGN PATENT DOCUMENTS

| | | |
|---|---|---|
| TW | 201103659 A1 | 2/2011 |
| TW | 201131660 A1 | 9/2011 |

(Continued)

OTHER PUBLICATIONS

Chinese Office Action dated Jan. 18, 2019 for Application No. 201610133564.1.

*Primary Examiner* — William F Kraig
*Assistant Examiner* — Khatib A Rahman
(74) *Attorney, Agent, or Firm* — Birch, Stewart, Kolasch & Birch, LLP

(57) ABSTRACT

Semiconductor device structures are provided. The semiconductor device structures include a semiconductor substrate. The semiconductor device structures also include an inner metal layer disposed on the semiconductor substrate and a top metal layer disposed on the inner metal layer, wherein the top metal layer has a first portion and a second portion, and wherein the first portion completely covers the inner metal layer, the second portion surrounds the first portion, and the first portion is separated from the second (Continued)

portion. The semiconductor device structures further include a passivation layer disposed on the top metal layer, wherein the passivation layer has a hollowed pattern to expose the top metal layer.

16 Claims, 7 Drawing Sheets

(56) References Cited

U.S. PATENT DOCUMENTS

| | | | | |
|---|---|---|---|---|
| 2016/0056105 A1* | 2/2016 | Chan | ................... | H01L 23/5227 257/737 |
| 2016/0163628 A1* | 6/2016 | We | ................... | H01L 23/49827 257/664 |
| 2016/0276425 A1* | 9/2016 | Saito | ....................... | H01L 28/20 |

FOREIGN PATENT DOCUMENTS

| | | | |
|---|---|---|---|
| TW | 201338109 | A | 9/2013 |
| TW | 201543649 | A | 9/2013 |

* cited by examiner

SEMICONDUCTOR DEVICE STRUCTURES

BACKGROUND OF THE INVENTION

Field of the Invention

The present invention relates to a semiconductor device structure, and in particular to the layout of a passivation layer and a top metal layer of the semiconductor device structure.

Description of the Related Art

In recent years, the development of semiconductor devices for use in computers, consumer electronics, and other fields has progressed rapidly. Currently, semiconductor device technology has been widely accepted in Metal-Oxide-Semiconductor Field-Effect Transistor (MOSFET) products that are marketed with a high market share.

Thin film resistors are widely used in various integrated circuits, wherein the polysilicon resistor is one of the main high-resistance elements. In recent years, smart products have flourished in terms of networking and automotive electronics, so it is worth paying attention to the accuracy of thin film resistors. Although semiconductor devices that currently exist are sufficient to meet their original intended use, they are not satisfactory in all respects. For example, current semiconductor devices facing issues marked by a drift rate of the thin film resistors' resistance value being too high. Mechanical stress is one of the main causes of resistance drift. For example, in the back-end-of-line (BEOL) process for manufacturing semiconductor devices, the stress from each process causes the resistors in the lower layer to generate a piezoresistance effect. Therefore, how to reduce the drift rate of the resistance value of the thin film resistors is a subject worthy of study.

BRIEF SUMMARY OF THE INVENTION

The disclosure provides a semiconductor device structure. The semiconductor device structure includes a semiconductor substrate. The semiconductor device structure also includes an inner metal layer disposed on the semiconductor substrate and a top metal layer disposed on the inner metal layer, wherein the top metal layer has a first portion and a second portion, and wherein the first portion completely covers the inner metal layer, the second portion surrounds the first portion, and the first portion is separated from the second portion. The semiconductor device structure further includes a passivation layer disposed on the top metal layer, wherein the passivation layer has a hollowed pattern to expose the top metal layer.

The disclosure provides a semiconductor device structure. The semiconductor device structure includes a semiconductor substrate. The semiconductor device structure also includes an inner metal layer disposed on the semiconductor substrate and a top metal layer disposed on the inner metal layer. The semiconductor device structure further includes a passivation layer disposed on the top metal layer. The passivation layer comprises a first passivation portion and a second passivation portion separated from the first passivation portion, wherein the second passivation portion surrounds the first passivation portion, and the top metal layer is exposed by the gap between the first passivation portion and second passivation portion.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1A:
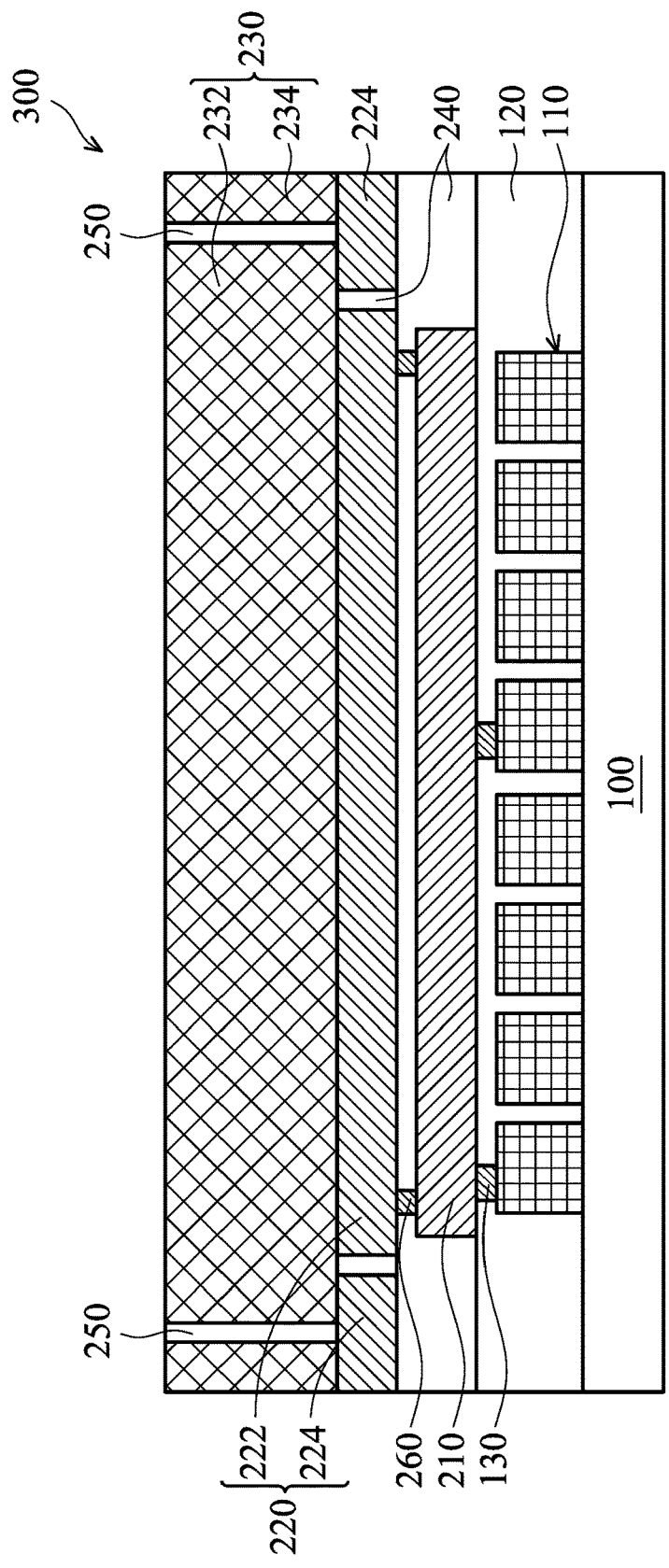
FIG. 1A is a cross-sectional representation of a semiconductor device structure in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

It should be noted that the elements or devices in the drawings of the present disclosure may be present in any form or configuration known to those skilled in the art. In addition, the expression "a layer overlying another layer", "a layer is disposed above another layer", "a layer is disposed on another layer" and "a layer is disposed over another layer" may indicate that the layer directly contacts the other layer, or that the layer does not directly contact the other layer, there being one or more intermediate layers disposed between the layer and the other layer.

In addition, in this specification, relative expressions are used. For example, "lower", "bottom", "higher" or "top" are used to describe the position of one element relative to another. It should be appreciated that if a device is flipped upside down, an element that is "lower" will become an element that is "higher". [00.16] The terms "about" and "substantially" typically mean+/−20% of the stated value, more typically +/−10% of the stated value, more typically +/−5% of the stated value. The stated value of the present disclosure is an approximate value. When there is no specific description, the stated value includes the meaning of "about" or "substantially".

It is also noted that the present disclosure presents embodiments of the layout of a passivation layer and a top metal layer of a semiconductor device structure, and may be included in an integrated circuit (IC) such as a microprocessor, memory device, and/or another IC. The IC may also include various passive and active microelectronic devices, such as thin film resistors, other capacitors (e.g. metal-insulator-metal capacitor, MIMCAP), inductors, diodes, metal-oxide-semiconductor field effect transistors (MOSFETs), complementary MOS (CMOS) transistors, bipolar junction transistors (BJTs), laterally diffused MOS (LDMOS) transistors, high power MOS transistors, or other types of transistors. One of ordinary skill may recognize other embodiments of semiconductor devices that may benefit from aspects of the present disclosure.

The present disclosure wants to solve the problem of the large shift rate in the resistance value of the thin film resistor of the semiconductor device structures, and the embodiments of the present disclosure use the layout of the passivation layer and the top metal layer to alleviate anisotropic stresses generated from the BEOL process in the manufacture of the semiconductor device to prevent the lower layer elements (e.g. thin film resistor) from generating a piezoresistance effect.

Referring to FIG. 1A, FIG. 1A is a cross-sectional representation of a semiconductor device structure 300 in accordance with some embodiments. The semiconductor device structure 300 includes a semiconductor substrate 100. The semiconductor substrate 100 includes silicon. Alternatively or additionally, the semiconductor substrate 100 may include other elementary semiconductors such as germanium. The semiconductor substrate 100 may also include a compound semiconductor such as silicon carbide, gallium arsenic, indium arsenide, and indium phosphide. The semiconductor substrate 100 may include an alloy semiconductor such as silicon germanium, silicon germanium carbide, gallium arsenic phosphide, and gallium indium phosphide. In some embodiments, the semiconductor substrate 100 includes an epitaxial layer. For example, the semiconductor substrate 100 may have an epitaxial layer overlying a bulk semiconductor. Furthermore, the semiconductor substrate 100 may include a semiconductor-on-insulator (SOI) structure. For example, the semiconductor substrate 100 may include a buried oxide (BOX) layer formed by a process such as separation by implanted oxygen (SIMOX), or another suitable technique such as wafer bonding and grinding.

The semiconductor substrate 100 may also include various p-type doped regions and/or n-type doped regions, implemented by a process such as ion implantation and/or diffusion. Those doped regions include n-well, p-well, light doped region (LDD), heavily doped source and drain (S/D), and various channel doping profiles configured to form various IC devices, such as a complimentary metal-oxide-semiconductor field-effect transistor (CMOSFET), imaging sensor, and/or thin film resistor. The semiconductor substrate 100 may further include other functional features such as a resistor or a capacitor formed in or on the substrate.

The semiconductor substrate 100 may also include an isolation feature. The isolation feature separates various device regions in the semiconductor substrate 100. The isolation features include different structures formed by using different processing technologies. For example, the isolation features may include shallow trench isolation (STI) features. The formation of an STI may include etching a trench in the semiconductor substrate 100 and filling in the trench with insulator materials such as silicon oxide, silicon nitride, or silicon oxynitride. The filled trench may have a multi-layer structure such as a thermal oxide liner layer with silicon nitride filling the trench. A chemical mechanical polishing (CMP) process may be performed to polish back excessive insulator materials and planarize the top surface of the isolation features.

The semiconductor device structure 300 includes a polysilicon layer 110 and a dielectric layer 120. As shown in FIG. 1A, the dielectric layer 120 is disposed on the polysilicon layer 110, and the polysilicon layer 110 is disposed on the semiconductor substrate 100 and in the dielectric layer 120. The polysilicon layer 110 is formed using a silicon-containing gas. The example of silicon-containing gas includes dichlorosilane (DCS), silane ($SiH_4$), methylsilane ($SiCH_6$), another suitable gas, or a combination thereof. The polysilicon layer 110 may be formed by using a chemical vapor deposition (CVD) process, a physical vapor deposition (PVD) process or another applicable process. The dielectric layer 120 is made of silicon nitride, silicon oxynitride, silicon carbide, silicon oxide, silicon carbon nitride, another suitable material, or a combination thereof. The dielectric layer 120 may be formed by deposition process, the deposition process includes CVD, PVD, atomic layer deposition (ALD), high-density plasma CVD (HDPCVD), metal organic CVD (MOCVD), remote plasma CVD (RPCVD), plasma-enhanced CVD (PECVD), plating, another suitable process, or a combination thereof. In some embodiments, the polysilicon layer 110 has many patterned sections, wherein a portion of the polysilicon layer 110 may be used as a gate structure (not shown) of the semiconductor device structure 300, and another portion of the polysilicon layer 110 may be used as a portion of a thin film resistor. In some embodiments, the polysilicon layer 110 may be replaced by other semiconductor materials.

The semiconductor device structure 300 includes a via 130. As shown in FIG. 1A, the via 130 is disposed on the polysilicon layer 110 and in the dielectric layer 120, and the via 130 is used to electrically connect the polysilicon layer 110 and an inner metal layer 210 thereon. The via 130 includes conductive materials, such as aluminum (Al), copper (Cu), tungsten (W), titanium (Ti), tantulum (Ta), titanium nitride (TiN), tantalum nitride (TaN), nickel silicide (NiS), cobalt silicide (CoSi), tantalum carbide (TaC), tantulum silicide nitride (TaSiN), tantalum carbide nitride (TaCN), titanium aluminide (TiAl), titanium aluminide nitride (TiAlN), other applicable conductive materials, or a combination thereof. In some embodiments, as shown in FIG. 1A, a portion of the polysilicon layer 110 is not electrically connected to the inner metal layer 210. Namely, there is no via 130 disposed on the portion of the polysilicon layer 110.

The semiconductor device structure 300 further includes a top metal layer 220, a via 260 and an interlayer dielectric (ILD) layer 240. As shown in FIG. 1A, the interlayer dielectric layer 240 is disposed on the dielectric layer 120. The inner metal layer 210 is disposed on the polysilicon layer 110 and electrically connected to the polysilicon layer 110 by the via 130. The top metal layer 220 is disposed on the inner metal layer 210 and electrically connected to the inner metal layer 210 by the via 260. The inner metal layer 210, the via 260 and the top metal layer 220 may be regarded as an inter-connection structure of the semiconductor device structure 300.

The formation of the inner metal layer 210, the via 260 and the top metal layer 220 includes a damascene process. It forms a trench and an opening of a via in the interlayer dielectric layer 240, and then fills a metal material in the opening of the trench and the via. The metal material may be formed by plating, CVD, ALD, PVD, a combination thereof or other similar processes. The metal material may be selected from a group consisting of copper, tungsten, aluminum, silver, gold, a combination thereof and other similar materials. FIG. 1A only depicts one inner metal layer 210, but in other embodiments, the inner metal layer 210 may further include more metal layers and via structures. The present disclosure is not limited thereto.

In addition, the interlayer dielectric layer 240 may include multilayers made of multiple dielectric materials, such as silicon oxide, silicon nitride, silicon oxynitride, phosphosilicate glass (PSG), borophosphosilicate glass (BPSG), low-k dielectric material, and/or other applicable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide, but they are not limited thereto. The interlayer dielectric layer 240 may be formed by CVD, PVD, ALD, spin-on coating, or other applicable processes. It's should be noted that the interlayer dielectric layer 240 may be a single layer or multilayers formed by multiple materials, and the present disclosure is not limited thereto.

As shown in FIG. 1A, the top metal layer 220 includes a first portion 222 and a second portion 224. In some embodiments, the first portion 222 covers the inner metal layer 210 completely. Namely, the projection of the first portion 222 covers the projection of the inner metal layer 210 completely. The second portion 224 surrounds the first portion 222 and is separated from the first portion 222 by the interlayer dielectric layer 240. In some embodiments, from the top view, the first portion 222 is a solid rectangle section, and the second portion 224 is an annular-shaped section. Although FIG. 1A depicts the top metal layer 220 as including two sections, in some other embodiments, the second portion 224 of the top metal layer 220 may further include two or more annular-shaped sections, and the first portion 222 may include another solid shape, and the present disclosure is not limited thereto. In some embodiments, the inner metal layer 210 is electrically connected to the first portion 222 of the top metal layer 220 by the via 260. In some embodiments, the second portion 224 of the top metal layer 220 is not electrically connected to the inner metal layer 210.

As shown in FIG. 1A, the semiconductor device structure 300 further includes a passivation layer 230 disposed on the top metal layer 220. The passivation layer 230 is made of oxide, such as silicon oxide, un-doped silicate glass (USG) or a similar oxide compound. In addition, the passivation layer 230 may be a composite material layer. For example, the passivation layer 230 includes a composite material layer which is composed of a silicon oxide layer and a silicon nitride layer on the silicon oxide layer.

In some embodiments, the passivation layer 230 includes a first passivation portion 232 and a second passivation portion 234, and the passivation layer 230 has a hollowed pattern 250 to expose the underlying top metal layer 220. The formation of the hollowed pattern 250 includes a photolithography process and an etching process. The photolithography processes include photoresist coating (e.g., spin-on coating), soft baking, mask alignment, exposure, post-exposure baking, developing the photoresist, rinsing and drying (e.g., hard baking). The photolithography process is also implemented or replaced by other proper methods such as maskless photolithography, electron-beam writing and ion-beam writing. The etching processes include dry etching, wet etching, or other etching methods.

Figure 1B:
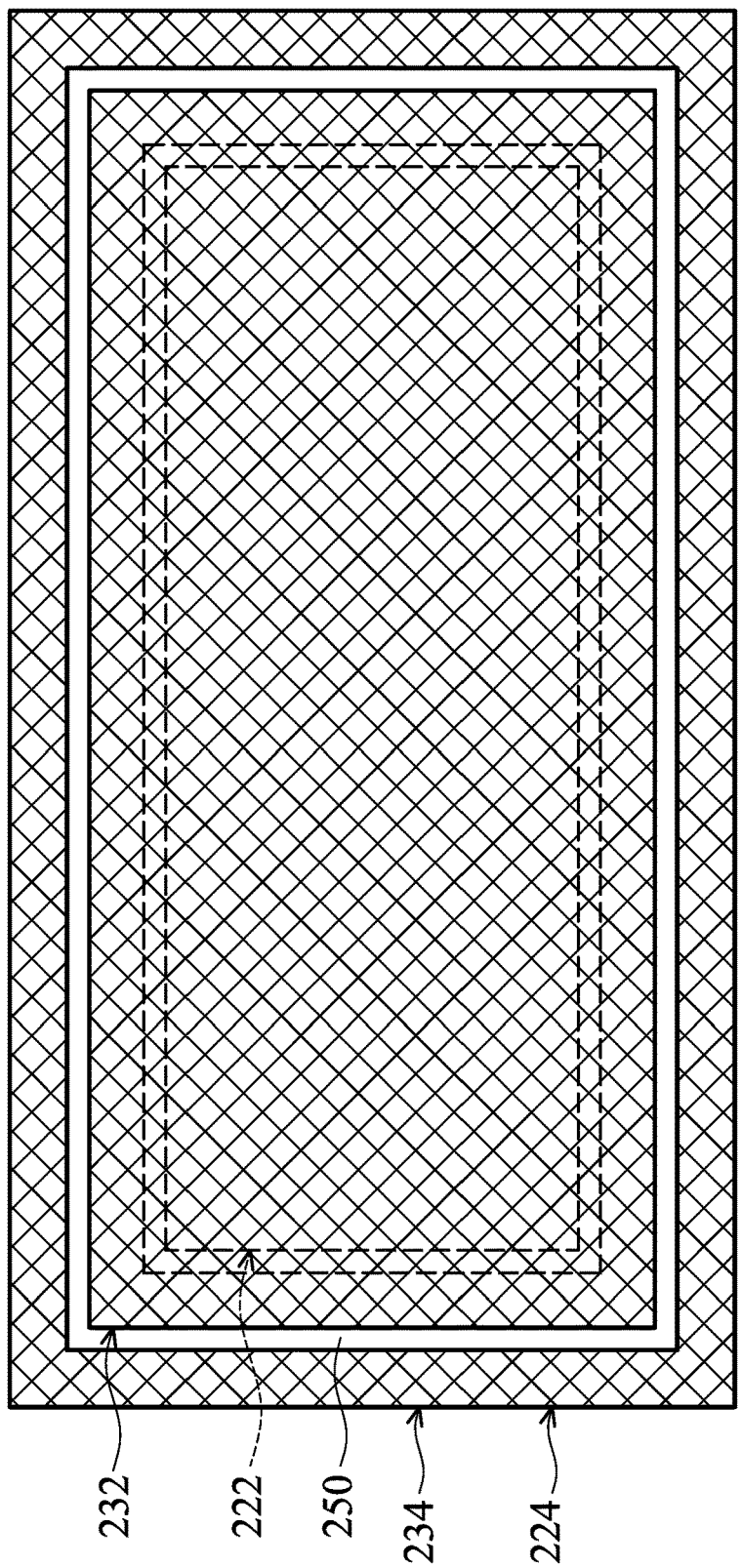
FIG. 1B is a top view of the layout of a passivation layer and a top metal layer of the semiconductor device structure shown in FIG. 1A in accordance with some embodiments.

Next, referring to FIGS. 1A and 1B, FIG. 1B is a top view of the layout of the passivation layer 230 and the top metal layer 220 of the semiconductor device structure 300 shown in FIG. 1A in accordance with some embodiments. For clearly depicting the layout of the passivation layer 230, the hollowed pattern 250 and the top metal layer 220, other elements in FIG. 1B are omitted.

In some embodiments, the first passivation portion 232 of the passivation layer 230 covers the first portion 222 of the top metal layer 220 completely, and covers a portion of the second portion 224. The second portion 224 of the top metal layer 220 is exposed by the hollowed pattern 250. As shown in FIG. 1B, the area of the first passivation portion 232 is larger than that of the first portion 222 of the top metal layer 220, and the area of the second passivation portion 234 is smaller than that of the second portion 224 of the top metal layer 220. In some embodiments, the first passivation portion 232 is a solid rectangle section. The second passivation portion 234 is an annular-shaped section and is separated from the first passivation portion 232 by the hollowed pattern 250. Although FIG. 1A depicts a passivation layer 230 with two sections, in some other embodiments, the second passivation portion 234 further includes two or more annular-shaped sections, and the first passivation portion 232 also includes another solid shape section. The present disclosure is not limited thereto.

The area of the hollowed pattern 250 is not limited. In some embodiments, the ratio of the area of the hollowed pattern 250 to the area of the passivation layer 230 is smaller than 25% of the area of the passivation layer 230.

In addition, as shown in FIG. 1A, the inner metal layer 210 is not covered by the second portion 224 of the top metal layer 220, and also not covered by the second passivation portion 234. The polysilicon layer 110 is not covered by the second portion 224 of the top metal layer 220, and also not covered by the second passivation portion 234.

Figure 2A:
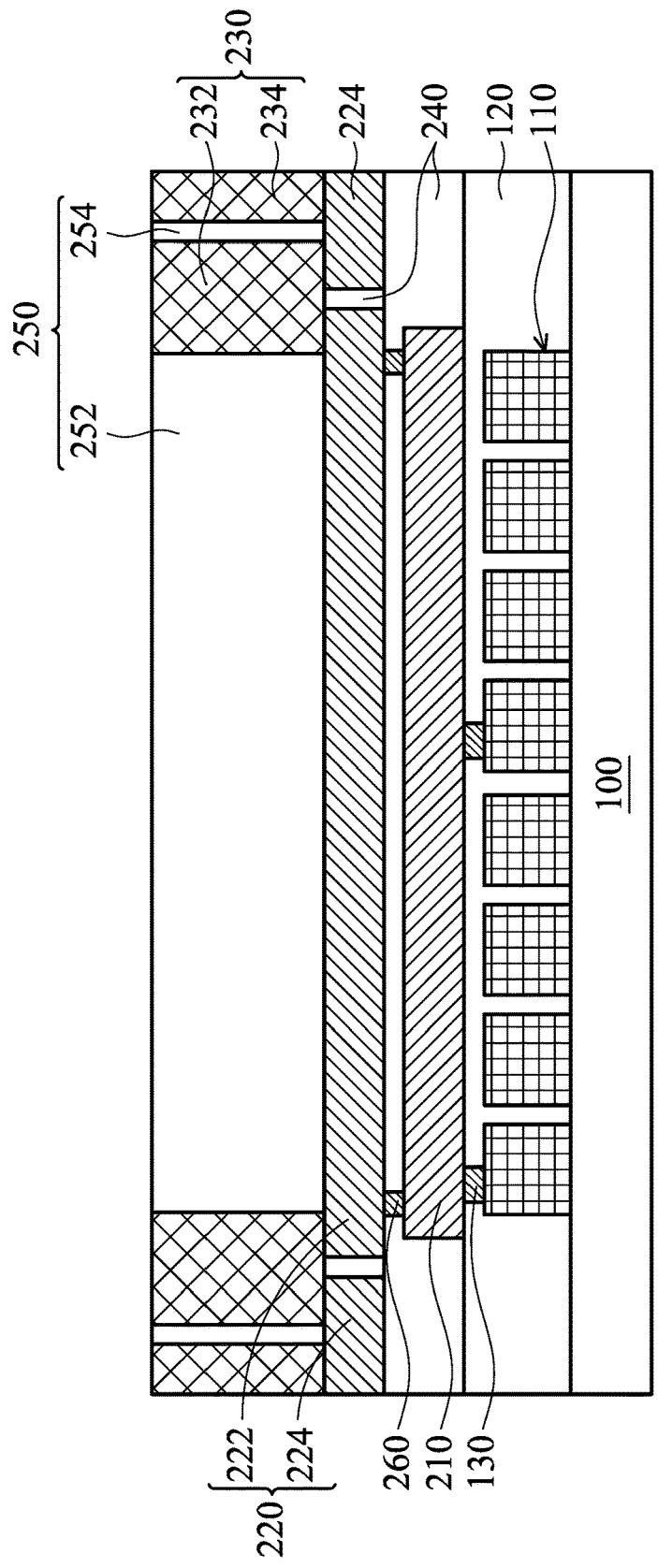
FIG. 2A is a cross-sectional representation of a semiconductor device structure in accordance with some embodiments.
Figure 2B:
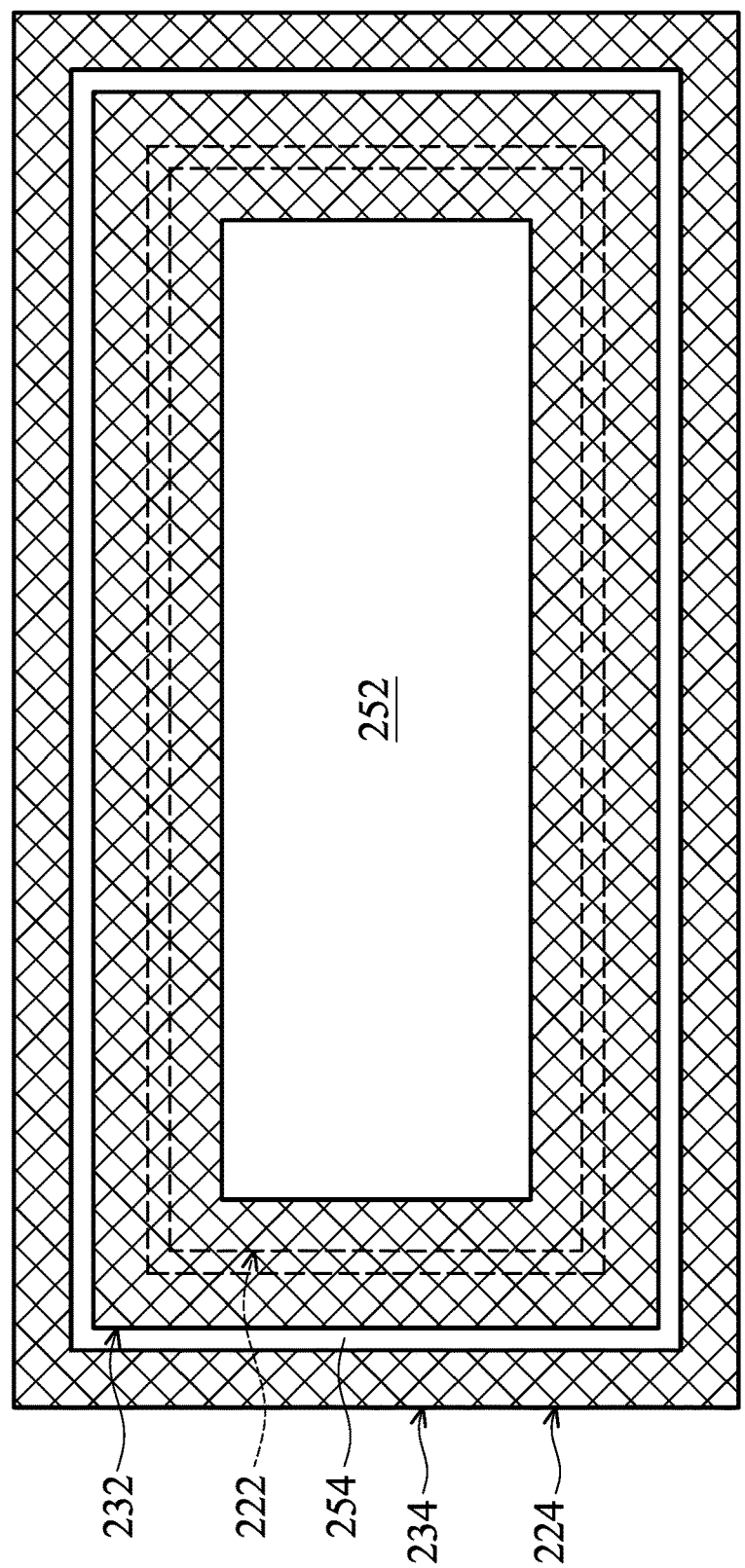
FIG. 2B is a top view of the layout of a passivation layer and a top metal layer of the semiconductor device structure shown in FIG. 2A in accordance with some embodiments.

Next, referring to FIGS. 2A and 2B, FIG. 2A is a cross-sectional representation of the semiconductor device structure 300 in accordance with some other embodiments, and FIG. 2B is a top view of the layout of the passivation layer 230 and the top metal layer 220 of the semiconductor device structure 300 shown in FIG. 2A in accordance with some embodiments. Descriptions of elements of the FIGS. 2A and 2B hereinafter that are the same as or similar to those previously described with reference to FIGS. 1A and 1B are omitted for brevity.

The difference between the embodiment shown in FIG. 2A and FIG. 1A is the layout of the passivation layer 230. As shown in FIG. 2A, in some embodiments, the hollowed pattern 250 includes a first hollowed area 252 and a second hollowed area 254. The first portion 222 of the top metal layer 220 under the passivation layer 230 is exposed by the first hollowed area 252, and the second portion 224 of the top metal layer 220 under the passivation layer 230 is exposed by the second hollowed area 254. As shown in FIG. 2B, the second hollowed area 254 surrounds the first hollowed area 252 and is separated from the first hollowed area 252. In some embodiments, the first passivation portion 232 covers a portion of the first portion 222 and a portion of the second portion 224 of the top metal layer 220. In this embodiment, the first portion 222 of the top metal layer 220 is not covered completely by the first passivation portion 232. As shown in FIG. 2A, the polysilicon layer 110 corresponds to the first hollowed area 252 of the hollowed pattern 250. Namely, the polysilicon layer 110 is not covered by the passivation layer 230. In this embodiment, the first passivation portion 232 is a hollow annular-shaped section, and the first portion 222 of the top metal layer 220 is exposed by the first hollowed area 252.

The area of the first hollowed area 252 is not limited. In some embodiments, the ratio of the area of the first hollowed area 252 to the area of the first portion 222 of the top metal layer 220 is greater than 50% of the area of the first portion 222.

Figure 3A:
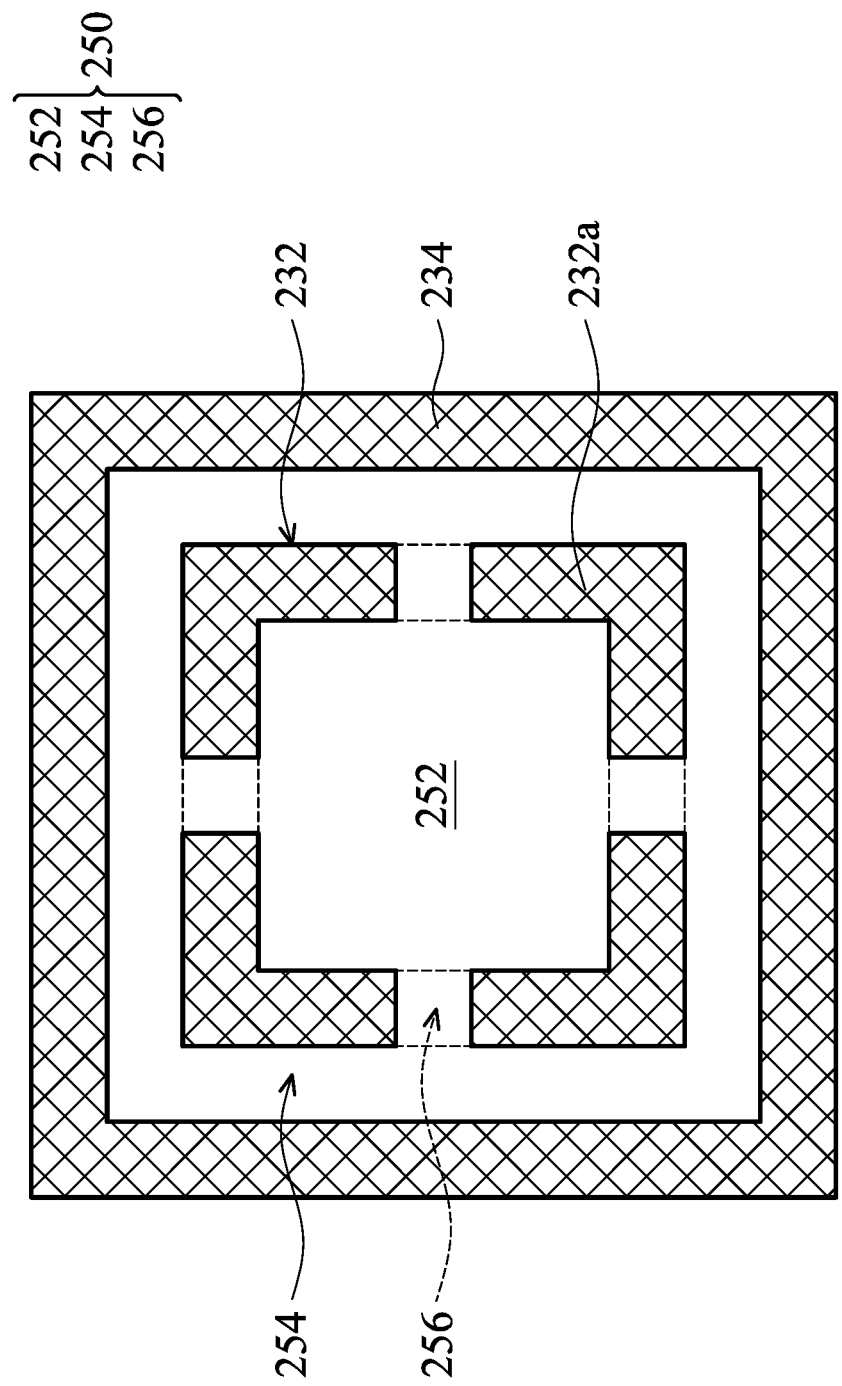
FIGS. 3A and 3B are top views of the layout of a passivation layer of a semiconductor device structure in accordance with some embodiments.
Figure 3B:
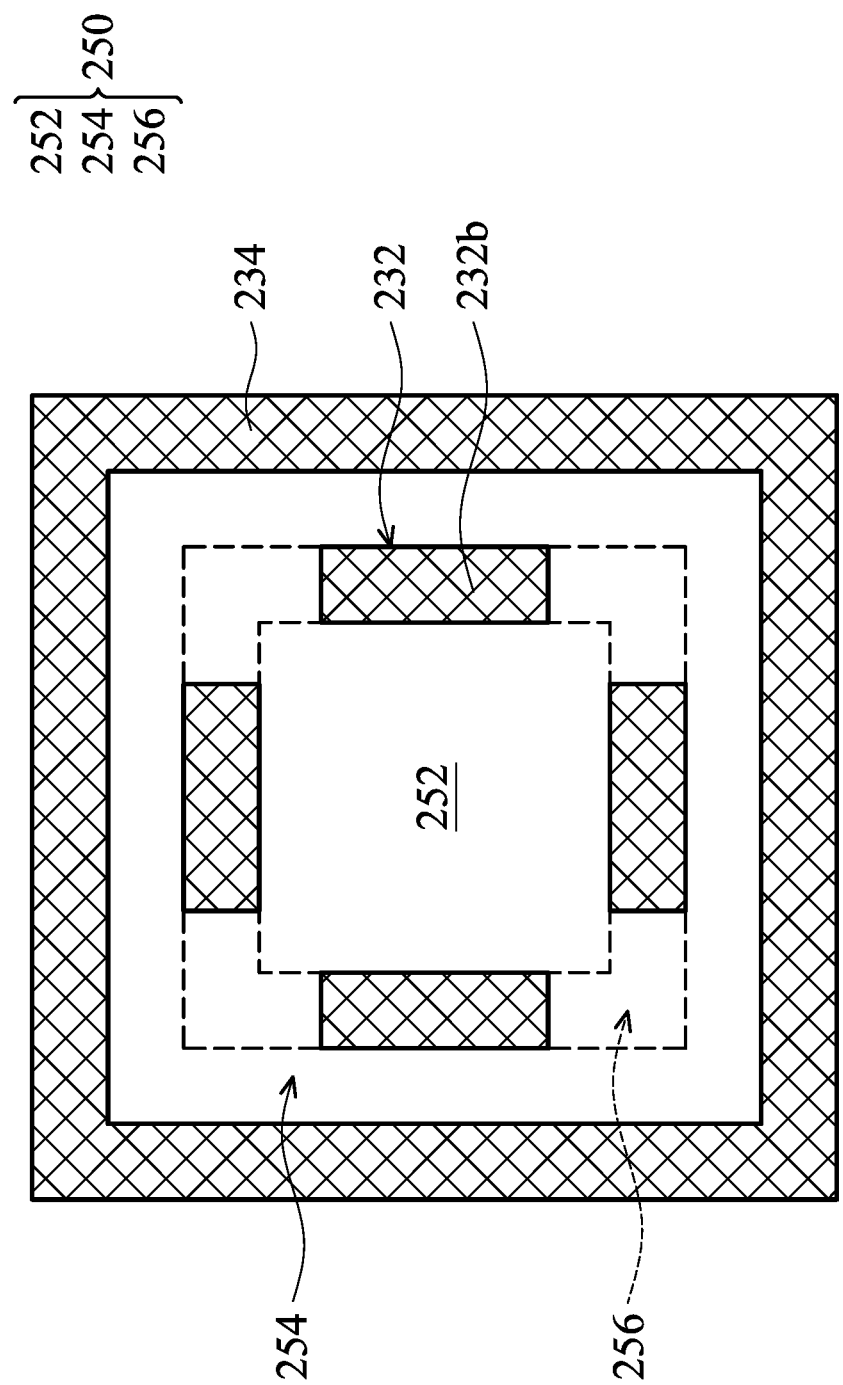

Next, referring to FIGS. 3A and 3B, FIGS. 3A and 3B are top views of the layout of the passivation layer 230 of the semiconductor device structure 300 in accordance with some other embodiments. FIGS. 3A and 3B only depict the sections of the passivation layer 230 and the hollowed area of the hollowed pattern 250 for brevity.

As shown in FIG. 3A, in some embodiments, the hollowed pattern 250 further includes one or more connection portions 256. The first hollowed area 252 is connected to the second hollowed area 254 by the connection portion 256. In this embodiment, the first passivation portion 232 is composed of a plurality of disconnected sections 232a. As shown in FIG. 3A, in some embodiments, every section 232a of the first passivation portion 232 has an L-shape. These sections 232a have a center of rotational symmetry such that when the pattern (namely, the layout of the first passivation portion 232) composed by these section 232a is rotated 360°/n (n is an integer which is greater than one), then the same pattern is obtained. For example, in the embodiment shown in FIG. 3A, when four sections 232a of the first passivation portion 232 are rotated 90° around the center of four section 232a as the center of rotational symmetry, then the same pattern is obtained.

As shown in FIG. 3B, in some other embodiments, the corner of the first passivation portion 232 in the FIG. 2B may be etched and removed, and then the first hollowed area 252 is connected to the second hollowed area 254. Namely, the portion of the corner of the first hollowed area 252 which is removed by an etching process may be regarded as the connection portion 256. In this embodiment, the first passivation portion 232 is composed of a plurality of disconnected sections 232b. As shown in FIG. 3B, every section 232b of the first passivation portion 232 is a rectangle. These sections 232b have a center of rotational symmetry such that when the pattern (namely, the layout of the first passivation portion 232) composed by these sections 232b is rotated 360°/n (n is an integer which is greater than one), the same pattern is obtained. For example, in the embodiment shown in FIG. 3B, when four sections 232b of the first passivation portion 232 are rotated 90° around the center of four sections 232b as a center of rotational symmetry, the same pattern is obtained.

Although the embodiments shown in FIGS. 3A and 3B only depict a first passivation portion 232 that has four sections, in some other embodiments, the first passivation portion 232 may have a different number of sections, and every section may include other shapes, but the present disclosure is not limited thereto.

Figure 4B:
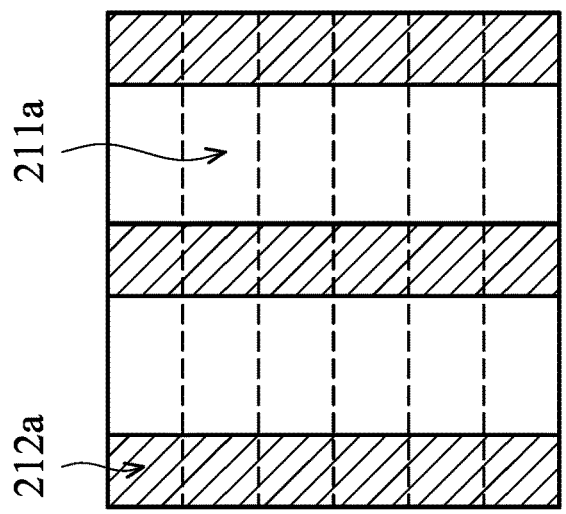
FIG. 4B is a top view of the layout of the inner metal layer shown in FIG. 4A in accordance with some embodiments.
Figure 4A:
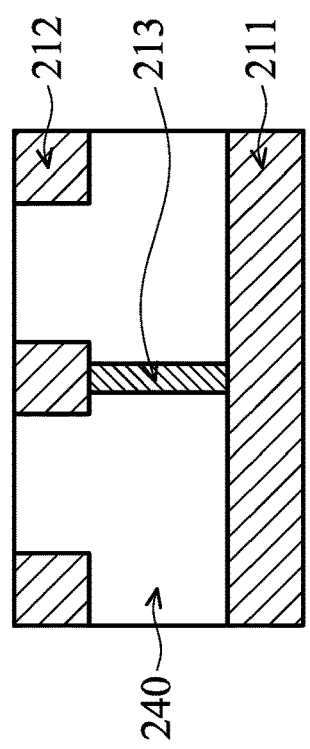
FIG. 4A is a cross-sectional representation of an inner metal layer of a semiconductor device structure in accordance with some embodiments.

Referring to FIGS. 4A and 4B, FIG. 4A is a cross-sectional representation of the inner metal layer 210 in accordance with some embodiments, and FIG. 4B is a top view of the layout of the inner metal layer 210 shown in FIG. 4A in accordance with some embodiments. FIGS. 4A and 4B only depict a plurality of sections included in a first inner metal layer 211 and in a second inner metal layer 212 of the inner metal layer 210 for brevity.

In some embodiments, as shown in FIG. 4A, the inner metal layer 210 includes the first inner metal layer 211, the second inner metal layer 212 disposed on the first inner metal layer 211 and a via 213. The first inner metal layer 211 is separated from the second inner metal layer 212 by the interlayer dielectric layer 240, and the first inner metal layer 211 is electrically connected to the second inner metal layer 212 by the via 213. As shown in FIG. 4B, in some embodiments, the first inner metal layer 211 and the second inner metal layer 212 are composed of a plurality of disconnected sections. For example, the first inner metal layer 211 is composed of a plurality of sections 211a extending along a first direction, and the second inner metal layer 212 is composed of a plurality of sections 212a extending along a second direction which is perpendicular to the first direction. In some embodiments, the shape of the section 211a and the section 212a include sheet, strip, lump or a combination thereof. In some embodiments, from a top view, the section 211a is perpendicular to the section 212a. In some other embodiments, from a top view, the section 211a is parallel to the section 212a (not shown). In addition, as shown in FIG. 4A, a portion of the section 212a is connected to the section 211a through the via 213, and a portion of the section 212a is not connected to the section 211a. In some embodiments, a portion of the section 211a and a portion of the section 212a may be disposed under the second portion 224 of the top metal layer 220 directly, and these sections 211a and 212a are connected to the second portion 224 of the top metal layer 220 through the via 213.

Although the embodiments shown in FIGS. 4A and 4B only depict the inner metal layer 210 as including a first inner metal layer 211, a second inner metal layer 212, and a via 213, in some other embodiments, the inner metal layer 210 further includes other metal layers and vias, and every metal layer is composed of sections including sheets, strips, lumps, or a combination thereof, and the present disclosure is not limited thereto.

The passivation layer of the semiconductor device structure of the embodiments shown in the present disclosure has a layout that may have a variety of hollowed patterns. These layouts alleviate the stress generated from the passivation layer. The top metal layer disposed underlying the hollowed pattern of the passivation layer can protect the lower layer elements (e.g. the inner metal layer). The layout of the top metal layer designed in a sheet-, strip-, or annular-shape can be used as a buffer structure between the passivation layer and the semiconductor substrate, and it alleviates anisotropic stresses generated by the BEOL process of semiconductor device manufacturing to prevent the lower layer elements from generating a piezoresistance effect. The thin film resistors of conventional semiconductor devices have large drift rate resistance value due to the piezoresistance effect. The present disclosure uses layouts of the passivation layers and the top metal layer to prevent the element underlying the passivation layer from generating a piezoresistance effect, and thus the drift rate of the resistance value of the thin film resistors of the semiconductor device of the present disclosure is smaller than that of the thin film resistors of a conventional semiconductor device. For example, the tolerance of the drift rate of the resistance value of the thin film resistors of the semiconductor device of the present disclosure is smaller than 5%, and that of the drift rate of the resistance value of the thin film resistors of a conventional semiconductor device is greater than 10%.

Although some embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor device structure, comprising:
   a semiconductor substrate;
   an inner metal layer disposed on the semiconductor substrate, wherein the inner metal layer includes a plurality of disconnected sections;
   a top metal layer disposed on the inner metal layer, wherein the top metal layer has a first portion and a second portion, and wherein the first portion completely covers all the disconnected sections of the inner metal layer, the second portion surrounds the first portion, and the first portion is separated from the second portion;
   a passivation layer disposed on the top metal layer, wherein the passivation layer has a hollowed pattern to expose the top metal layer, and the first portion of the top metal layer is exposed by the hollowed pattern; and
   a polysilicon layer between the semiconductor substrate and the inner metal layer, wherein the polysilicon layer is not covered by the second portion of the top metal layer and the passivation layer.

2. The semiconductor device structure as claimed in claim 1, wherein the second portion of the top metal layer is exposed by the hollowed pattern, and the polysilicon layer is covered by the passivation layer.

3. The semiconductor device structure as claimed in claim 1, wherein a portion of the polysilicon layer is a thin film resistor.

4. The semiconductor device structure as claimed in claim 1, wherein the inner metal layer is not covered by the second portion of the top metal layer.

5. The semiconductor device structure as claimed in claim 1, wherein the hollowed pattern comprises:
   a first hollowed area; and
   a second hollowed area, wherein the second hollowed area surrounds the first hollowed area.

6. The semiconductor device structure as claimed in claim 5, wherein the first portion of the top metal layer is exposed by the first hollowed area, and the second portion of the top metal layer is exposed by the second hollowed area.

7. The semiconductor device structure as claimed in claim 5, wherein the hollowed pattern further comprises:
   a connection portion, wherein the first hollowed area is connected to the second hollowed area by the connection portion.

8. The semiconductor device structure as claimed in claim 1, wherein the inner metal layer comprises:
   a first inner metal layer; and
   a second inner metal layer disposed on the first inner metal layer, wherein the first inner metal layer and the second inner metal layer are composed of disconnected sections.

9. The semiconductor device structure as claimed in claim 8, wherein the first inner metal layer is perpendicular to the second inner metal layer.

10. A semiconductor device structure, comprising:
    a semiconductor substrate;
    an inner metal layer disposed on the semiconductor substrate, wherein the inner metal layer includes a plurality of disconnected sections that are electrically connected to a polysilicon layer disposed between the inner metal layer and the semiconductor substrate;
    a top metal layer disposed on the inner metal layer, wherein the top metal layer has a first portion and a second portion that surrounds the first portion, and wherein the first portion covers all the disconnected sections of the inner metal layer; and
    a passivation layer disposed on the top metal layer, wherein the passivation layer comprises a first passivation portion and a second passivation portion separated from the first passivation portion, the second passivation portion surrounds the first passivation portion, and the top metal layer is exposed by a gap between the first passivation portion and second passivation portion, and wherein the polysilicon layer is not covered by the passivation layer, and a portion of the polysilicon layer is a thin film resistor.

11. The semiconductor device structure as claimed in claim 10, wherein the first passivation portion of the passivation layer covers the first portion of the top metal layer and a portion of the second portion of the top metal layer.

12. The semiconductor device structure as claimed in claim 11, wherein the first passivation portion of the passivation layer covers the first portion of the top metal layer completely.

13. The semiconductor device structure as claimed in claim 11, wherein the first portion of the top metal layer is not covered completely by the first passivation portion of the passivation layer.

14. The semiconductor device structure as claimed in claim 13, wherein the first passivation portion of the passivation layer is composed of a plurality of disconnected sections.

15. The semiconductor device structure as claimed in claim 14, wherein every section of the disconnected sections comprises an L-shape or a rectangle, the disconnected sections are arranged in an annular shape, and the disconnected sections have a center of rotational symmetry.

16. The semiconductor device structure as claimed in claim 11, wherein the first passivation portion of the passivation layer comprises an annular shape.

* * * * *